US012635430B2

(12) United States Patent
Matsui et al.

(10) Patent No.: US 12,635,430 B2
(45) Date of Patent: May 19, 2026

(54) PLASMA PROCESSING METHOD

(71) Applicant: Hitachi High-Tech Corporation, Tokyo (JP)

(72) Inventors: Miyako Matsui, Tokyo (JP); Kenichi Kuwahara, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 187 days.

(21) Appl. No.: 18/027,188

(22) PCT Filed: Mar. 2, 2022

(86) PCT No.: PCT/JP2022/008892
§ 371 (c)(1),
(2) Date: Mar. 20, 2023

(87) PCT Pub. No.: WO2023/166613
PCT Pub. Date: Sep. 7, 2023

(65) Prior Publication Data
US 2024/0321583 A1     Sep. 26, 2024

(51) Int. Cl.
*H10P 50/24*          (2026.01)
*H10P 74/20*          (2026.01)

(52) U.S. Cl.
CPC .......... *H10P 50/242* (2026.01); *H10P 74/203* (2026.01)

(58) Field of Classification Search
None
See application file for complete search history.

(56) References Cited

U.S. PATENT DOCUMENTS

| 5,352,324 | A | 10/1994 | Gotoh et al. |
|---|---|---|---|
| 5,951,879 | A | 9/1999 | Miyamoto et al. |
| 6,355,581 | B1 | 3/2002 | Vassiliev et al. |
| 8,124,537 | B2 | 2/2012 | Lee et al. |
| 9,530,666 | B2 | 12/2016 | Mizuno et al. |
| 10,196,738 | B2* | 2/2019 | Lee .................... C23C 14/5813 |
| 2001/0049182 | A1 | 12/2001 | Urakami et al. |
| 2007/0026677 | A1 | 2/2007 | Ji et al. |
| 2007/0238305 | A1 | 10/2007 | Delgadino et al. |

(Continued)

FOREIGN PATENT DOCUMENTS

| JP | H104-240729 A | 8/1992 |
|---|---|---|
| JP | H11-111699 A | 4/1999 |

(Continued)

OTHER PUBLICATIONS

Search Report mailed Apr. 26, 2022 in International Application No. PCT/JP2022/008892.

(Continued)

*Primary Examiner* — Stephanie P Duclair
(74) *Attorney, Agent, or Firm* — Miles & Stockbridge, P.C.

(57) ABSTRACT

A plasma processing method of forming a protective film for suppressing etching only a desired material in a pattern to etch a pattern is provided. A plasma processing method for plasma etching a film to be etched formed on a sample includes a cleaning step of cleaning a surface of the sample, a protective film forming step of selectively forming a protective film on a desired material in a pattern formed on the film to be etched, an oxidation step of oxidizing the protective film after the protective film forming step, and an etching step of plasma-etching the film to be etched.

10 Claims, 7 Drawing Sheets

(56) References Cited

U.S. PATENT DOCUMENTS

| | | | |
|---|---|---|---|
| 2008/0020584 A1 | 1/2008 | Hirotsu et al. | |
| 2011/0139748 A1 | 6/2011 | Donnelly et al. | |
| 2013/0023125 A1 | 1/2013 | Singh | |
| 2015/0235861 A1 | 8/2015 | Mizuno et al. | |
| 2016/0099187 A1 | 4/2016 | Lian | |
| 2016/0379841 A1 | 12/2016 | Hidaka et al. | |
| 2018/0151346 A1* | 5/2018 | Blanquart | H01L 21/042 |
| 2018/0233350 A1 | 8/2018 | Tois et al. | |
| 2018/0269118 A1 | 9/2018 | Matsui et al. | |
| 2019/0019689 A1 | 1/2019 | Kihara et al. | |
| 2020/0135898 A1 | 4/2020 | Joseph et al. | |
| 2020/0335354 A1* | 10/2020 | Matsui | H01L 21/31116 |
| 2022/0028697 A1 | 1/2022 | Tan et al. | |
| 2022/0216050 A1 | 7/2022 | Yu et al. | |

FOREIGN PATENT DOCUMENTS

| | | | |
|---|---|---|---|
| JP | 2001-351865 A | 12/2001 | |
| JP | 2003-083720 A | 3/2003 | |
| JP | 2005-079289 A | 3/2005 | |
| JP | 2005-294348 A | 10/2005 | |
| JP | 2007-258586 A | 10/2007 | |
| JP | 2008-060566 A | 3/2008 | |
| JP | 2012-529777 A2 | 11/2012 | |
| JP | 2014-232825 A | 12/2014 | |
| JP | 2017-011167 A | 1/2017 | |
| JP | 2017-212331 A | 11/2017 | |
| JP | 2018-137435 A | 8/2018 | |
| JP | 2018-157048 A | 10/2018 | |
| JP | 2022-506438 A | 1/2022 | |
| KR | 10-0190498 B1 | 6/1999 | |
| KR | 10-2017-0000791 A | 1/2017 | |
| KR | 10-2018-0060983 A | 6/2018 | |
| KR | 10-2020-0096753 A | 8/2020 | |
| TW | 202111812 A | 3/2021 | |
| WO | 2014046083 A1 | 3/2014 | |
| WO | 2020121540 A1 | 6/2020 | |

OTHER PUBLICATIONS

Notice of Allowance mailed Jun. 3, 2022 in U.S. Appl. No. 16/957,347.

Notice of Allowance mailed Jan. 28, 2022 in U.S. Appl. No. 16/957,347.

Office Action mailed Jun. 18, 2021 in U.S. Appl. No. 16/957,347.

Search Report mailed Mar. 9, 2021 in International Application No. PCT/JP2020/046976.

Search Report mailed Mar. 10, 2020 in International Application No. PCT/JP2019/049420.

Written Opinion mailed Mar. 10, 2020 in International Application No. PCT/JP2019/049420.

Dominik Metzler et al "Fluorocarbon assisted atomic layer etching of SiO2 using cyclic Ar/C4F8 plasma" Journal of Vacuum Science & Technology, A32, Mar. 2014 (5 pages).

Office Action mailed Aug. 11, 2023 in Taiwanese Application No. 112106632.

Office Action mailed May 2, 2024 in Korean Application No. 10-2023-7004874.

* cited by examiner

CL₂ FLOW RATE

TIME

PLASMA PROCESSING METHOD

TECHNICAL FIELD

The present invention relates to a plasma processing method and a plasma processing apparatus, and more particularly to a plasma processing method and a plasma processing apparatus including a step of forming a desired etching protective film on a top surface of a pattern on a wafer.

BACKGROUND ART

Due to the miniaturization and three-dimensionalization of functional element products such as semiconductor elements, three-dimensional processing technology for grooves and holes using various materials such as thin film spacers and metals as a mask has become important in a dry etching process in semiconductor manufacturing. The thickness of a mask, a gate insulating film, an etch stopper, etc. in a pattern of semiconductor devices is becoming thinner, and processing techniques that control shapes at the atomic layer level have been required. Furthermore, as devices become three-dimensional, the number of processes for processing complicated shapes is increasing. As a technique in which when processing such devices in a dry etching process, a protective film is formed on the pattern within an etching apparatus to uniformly adjust a pattern dimension and suppress a variation in the dimension in order to control the pattern dimension, PTL 1 discloses a method of forming a protective film on a mask pattern before dry etching in order to suppress the dimensional variation of the mask pattern. In this technique, the dimensional variation within a wafer is suppressed by providing a temperature distribution within the wafer so that the protective film can be formed so as to suppress the dimensional variation of a width of an initial mask pattern.

Further, PTL 2 discloses a technique in which in order to process a desired pattern with high selectivity with as little etching of a material to be etched such as a mask as possible, after a protective film is formed on the pattern in an etching apparatus, etching is performed with the protective film as the mask. PTL 2 discloses a technique in which in order to make the film thickness and dimensions of the protective film uniform, a protective film is formed on the pattern before dry etching, and a part of the protective film is removed so that the film thickness and dimensions of the formed protective film become uniform within a wafer surface, and dry etching is performed with the uniform protective film within the wafer surface as a mask.

CITATION LIST

Patent Literature

PTL 1: Japanese Unexamined Patent Application Publication No. 2017-212331
PTL 2: International Publication No. 2020/121540

SUMMARY OF INVENTION

Technical Problem

As described above, along with the miniaturization and complexity of patterns in three-dimensional devices, technology is important in which a processing shape of a device with a fine and complicated structure can be controlled at an atomic layer level, and high selectivity can be achieved for various types of films. In order to perform such processing, a technique is disclosed in which etching is performed after forming a protective film on the pattern in the dry etching apparatus before processing the pattern in the dry etching apparatus.

First, PTL 1 discloses a method of depositing a film on the mask pattern surface before etching as a method of suppressing variations in a minimum line width of the pattern. At this time, since a deposition rate of the deposited film depends on a wafer temperature, the wafer temperature is changed in each region so as to correct a relationship between the deposition rate and the temperature and the variation in the pattern dimension measured in advance, thereby forming a thin film for correcting the variation in the groove width and adjusting the groove width within the wafer surface. In order to suppress the etching of a top surface of the pattern, it is necessary to form the protective film with a thickness that prevents energy of ions irradiated from a plasma from being supplied to an interface between the protective film and the pattern surface. In the technique of PTL 1, since, as shown in FIG. 3, deposited films 120 having a film thickness approximately equal to that of side surfaces 122 are formed on a bottom surface 123 of a pattern formed on a substrate 103 and a region 124 without the pattern, a dimensional variation of the pattern can be reduced. However, since the thickness of the deposited films on the side surfaces 122 and the thicknesses of a top surface 121, the bottom surface 123 of the pattern, and the region 124 without any pattern cannot be adjusted independently, the deposited film 120 is also formed in the bottom surface 123 of the pattern, which is a region to be etched, and the region 124 having not pattern. Therefore, the selectivity in etching could not be improved.

PTL 2 discloses a protective film forming method including a protective film deposition step of forming a protective film having a width larger than a width of an upper portion of a pattern on the upper portion of the pattern without depositing a film on a groove bottom of the pattern, and a protective film partial removal step of removing an excessively deposited film in a wafer central portion in a wafer in-plane distribution of a deposited film formed in a deposition step, and controlling a wafer in-plane uniformity and a wafer in-plane variation of the width of the protective film. In the method disclosed in PTL 2, for example, when a deposited film is formed in a groove pattern with a high pattern density, sedimentary particles such as radicals generated by a plasma are less likely to enter the groove of the pattern, and therefore the deposited film can be formed only on the upper portion of the pattern.

However, in the pattern on the wafer during the semiconductor device manufacturing process, as shown in FIG. 4, in some cases, a region 107 in which patterns 102 with high density are formed, a region 108 having no pattern 102, and a region in which a space width between the patterns is sufficiently large and deposition components such as ions 130 and radicals 131 generated by the plasma can sufficiently penetrate the space between the patterns are mixed. When processing a wafer having such patterns, in the method disclosed in PTL 2, for example, as shown in FIG. 4, in a region 107 in which the patterns are dense, a thick protective film 101 is formed on each top surface of the patterns. However, at the same time, because the sedimentary particles are sufficiently irradiated onto a surface 109 of a region 108 having no pattern, a thick protective film 104 is formed. In a subsequent etching process, it has been difficult to etch a bottom 106 of the patterns and the surface 109 of the region 108 having no pattern at the same time because the thick protective film 104 inhibits the etching of the surface 109 of the region 108 having no pattern.

An object of the present invention is to provide a protective film forming method which is capable of forming a protective film for suppressing etching only on a desired material in a pattern without depositing an unnecessary deposition film in a region with few patterns or a region with no pattern on a wafer before etching. Another object of the present invention is to provide a plasma processing method for etching a pattern using the protective film forming method.

Solution to Problem

In order to solve the above-described problems of the prior art, in the plasma processing method according to the present invention, it is conceivable that a deposited film is selectively formed on a material forming the pattern whereby a protective film can be formed on only a desired surface of the pattern without forming an unnecessary deposited film in a region having no pattern and a groove of the pattern having a large groove width. First, there is provided a way performing a pretreatment step (cleaning step) for removing a natural oxide film formed on sample placed on a sample table and a residue generated on the sample in a step before the sample is placed on the sample table and cleaning a surface of the pattern. Further, there is provided a way for supplying a protective film forming gas to a processing chamber in order to selectively form a protective film on a pattern material using plasma. As a way for selectively forming a protective film on the pattern material, there is provided a way performing a step (protective film forming step) of introducing a protective film forming gas into the processing chamber, generating a plasma by a plasma generation unit, and selectively depositing a protective film on the material of the pattern surface formed on the sample placed on the sample table. Furthermore, there is provided a way performing a processing step (oxidation step) of modifying the formed protective film to ensure etching resistance in a subsequent step. Thereafter, the sample is etched by inclusion of a step (etching step) of supplying the etching processing gas to the processing chamber, generating a plasma of the etching processing gas by the plasma generation unit, and etching the sample having the protective film on the surface of the pattern to etch and remove pattern regions to be etched between the patterns and in a region where no pattern is formed.

Furthermore, in order to etch a thick film or process a bottom of a pattern with a high aspect ratio, the step (protective film forming step) of selectively depositing the protective film, the step (oxidation process) of modifying the deposited protective film, and the step (etching process) of etching the film to be etched are cyclically repeated.

In order to solve the above-described problems of the prior art, a plasma processing apparatus according to the present invention includes a processing chamber having a sample stage on which a patterned sample is placed, a gas supply unit that switchingly supplies a plurality of processing gases to an inside of the processing chamber, and a plasma generation unit that generates a plasma of the processing gas supplied to the inside of the processing chamber by the gas supply unit. Further, the plasma processing apparatus includes an optical system that irradiates a sample placed on a sample table with light and detecting a spectrum of an interference light from the sample, and a control unit that controls the gas supply unit, the plasma generation unit, and the optical system. The control unit controls the gas supply unit to supply a gas for forming the protective film into the processing chamber, and controls the plasma generation unit to selectively form a protective film on the material of the surface of the sample placed on the sample table. Further, the control unit controls the gas supply unit to switch the gas to be supplied to the inside of the processing chamber to a gas for modifying the protective film, and controls the plasma generation unit to cause the protective film formed on the surface, which placed on the sample table, to be subjected to an oxidation treatment until the formed protective film has a predetermined oxygen concentration. The control unit controls the gas supply unit to switch the gas supplied to the inside of the processing chamber to an etching gas, and controls the plasma generation unit to etch a sample having the formed protective film on the surface, which is placed on the sample stage.

Advantageous Effects of Invention

According to the present invention, the protective film having high etching resistance can be selectively formed on the material to be etched configuring the pattern without forming an unnecessary protective film on a region to be etched where no pattern is formed before the etching process, and fine patterns can be etched with high selectivity, high precision, and excellent reproducibility. For example, as shown in FIG. 5, according to the present invention, a protective film 101 with high etching resistance can be formed on each top surface of patterns 102 in a densely patterned region 107. On the other hand, no protective film 104 shown in FIG. 4 is formed on a surface 109 of a region 108 having no pattern. Therefore, the bottom 106 of the pattern and the surface 109 of the region 108 having no pattern can be etch at the same time without etching the top surface of the pattern 102 so that the fine pattern can be etched with high selectivity, high accuracy, and excellent reproducibility.

BRIEF DESCRIPTION OF DRAWINGS

FIG. 11B is a schematic diagram showing the bonding state of Si in the protective film 118 when an O/Si composition ratio is 0.5.

FIG. 12 is an illustrative diagram of a cycle processing method according to the present example.

DESCRIPTION OF EMBODIMENTS

Figure 1:
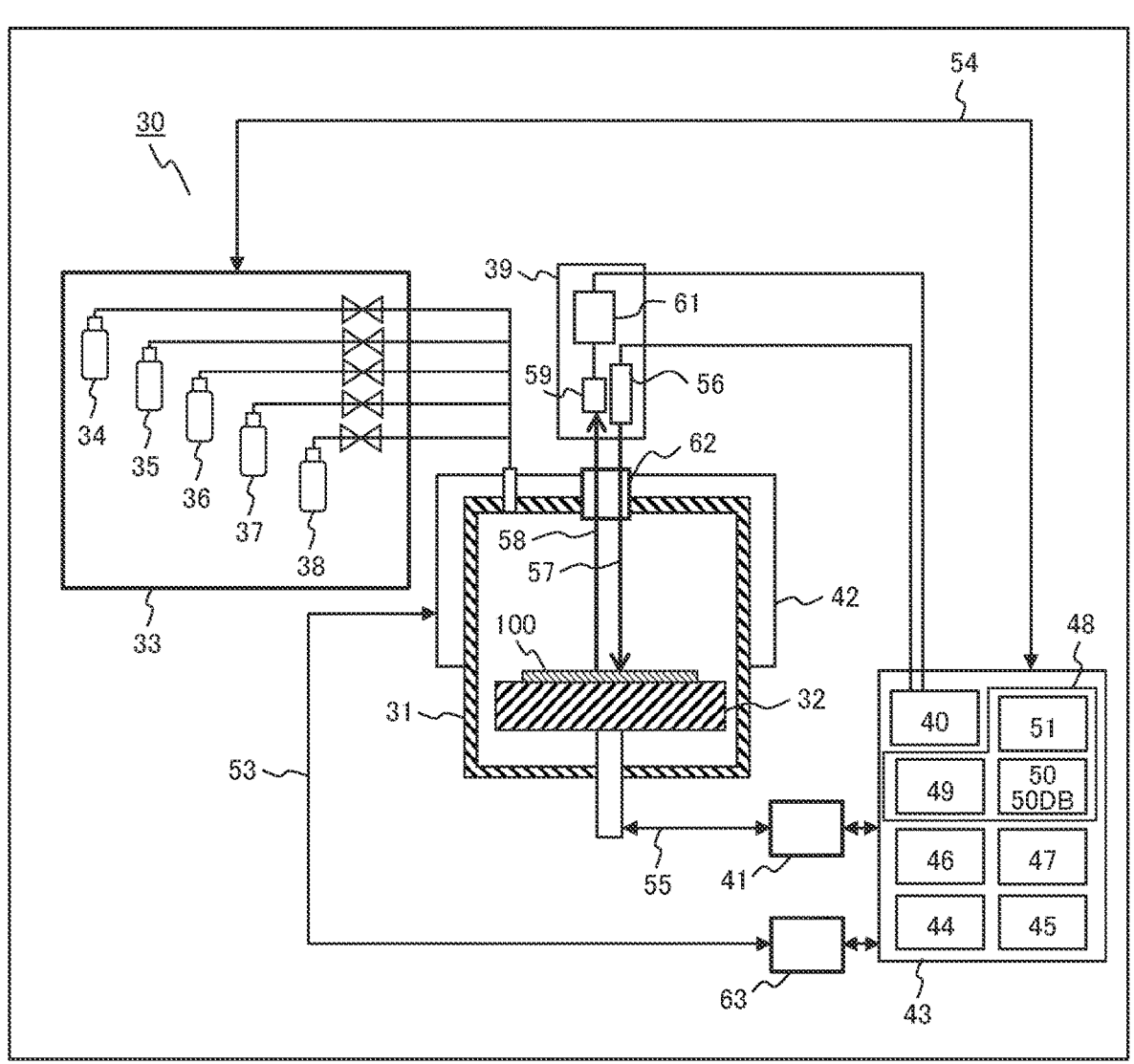
FIG. 1 is a diagram showing an example of a plasma processing apparatus according to the present invention.

Hereinafter, embodiments of the present invention will be described in detail with reference to the drawings. It should be noted that, in all the drawings, the same reference numerals are given to the parts having the same functions, and the repetitive description may be omitted.

EXAMPLES

An etching apparatus 30 according to the present example selectively deposits a protective film 118 with high etching resistance only on a desired non-etching material on a surface of a fine pattern 102 formed on a surface of a wafer 100 which is a sample, and etches and removes a material to be etched under the pattern on which the protective film 118 is formed.

FIG. 1 shows an overall configuration of an example of a plasma processing apparatus according to this example. The etching apparatus 30, which is a plasma processing apparatus, includes a processing chamber 31, a wafer stage (also referred to as a sample table) 32 on which a wafer 100, which is a sample, is placed, a gas supply unit 33, an optical system 39, a bias power supply 41, a radio frequency application unit 42, a device control unit 43, and the like. The device control unit 43 includes functional blocks such as an optical system control unit 40, a gas control unit 44, an exhaust system control unit 45, a radio frequency control unit 46, a bias control unit 47, a deposition process control unit 48, a determination unit 49, and a storage unit 51. Each functional block that configures the device control unit 43 can be realized by a single personal computer (PC). The deposition process control unit 48 includes the determination unit 49, a database storage unit 50, and a storage unit 51, and the determination unit 49 can determine that the protective film 118 (protective film 101 in FIG. 5) has been formed only on a desired material (on a pattern 102 in FIG. 5) referring a signal transmitted from the optical system control unit 40 to a database 50DB stored in the database storage unit 50.

The etching apparatus 30 includes a wafer stage 32 provided in the processing chamber 31 and a gas supply unit 33 having gas cylinders and valves. A protective film forming gas 34, a protective film forming gas 35, a protective film forming gas 36, a film quality control gas 37, and an etching gas 38 are each supplied into the processing chamber 31 according to processing steps, based on a control signal 54 from the device control unit 43.

The processing gas supplied into the processing chamber 31 is decomposed into a plasma in the processing chamber 31 by a radio frequency power 53 to be applied to a radio frequency application unit 42 from a radio frequency power supply 63 controlled by the device control unit 43. A pressure in the processing chamber 31 can be kept constant by a variable conductance valve and a vacuum pump (neither shown) connected to the processing chamber 31 while a desired flow rate of the processing gas is flowing. Radicals generated by a plasma decomposition in the processing chamber 31 diffuse in the processing chamber 31 and irradiate the surface of the wafer 100. The ions generated by the plasma are accelerated by a bias voltage 55 applied to the wafer stage 32 from the bias power supply 41 controlled by the bias control unit 47 and irradiated onto a surface of the wafer 100.

The optical system 39 is configured to evaluate a deposition state of the protective film formed on the wafer 100. The optical system 39 acquires the spectrum of light emitted from the optical system 39 and reflected by the wafer 100 so as to evaluate that the protective film is selectively deposited on a desired material of a pattern formed on the wafer, and evaluate the film quality and thickness of the protective film.

In order to determine whether the protective film is selectively deposited only on the desired material, first, as reference data, the wafer 100 on which a reference pattern in which the protective film is selectively deposited on the desired material of the pattern is introduced into the processing chamber 31. Information on the shape and film thickness of the protective film, film thickness, and selectivity is stored in advance as wafer information in the database 50DB, the storage unit 51 of the deposition process control unit 48, and the like.

Next, in the optical system 39, a reference groove pattern on the wafer 100 is irradiated with incident light 57 emitted from a light source 56. As the light source 56, for example, light in a wavelength range between 190 nm and 900 nm is used. Reflected light (interference light) 58 reflected by the reference pattern is detected by a detector 59, passes through an optical fiber, is split by a spectroscope 61, and is sent to the optical system control unit 40 as a reflection spectrum. Reflection spectrum information sent to the optical system control unit 40 is sent to the deposition process control unit 48 as reference data and stored in advance in the database storage unit 50 as the database 50DB.

Figure 5:
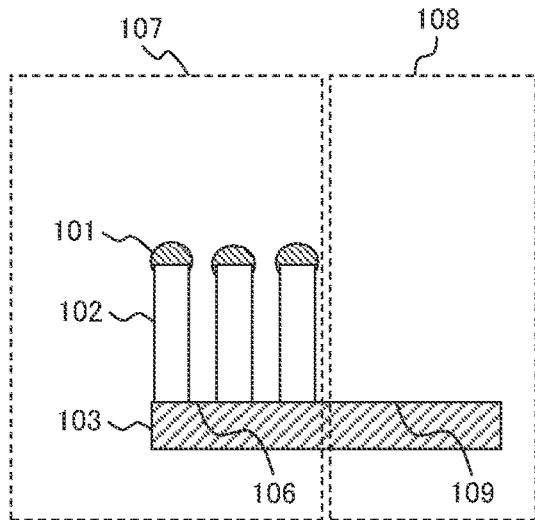
FIG. 5 is an illustrative diagram of a protective film forming method according to an example.
Figure 6:
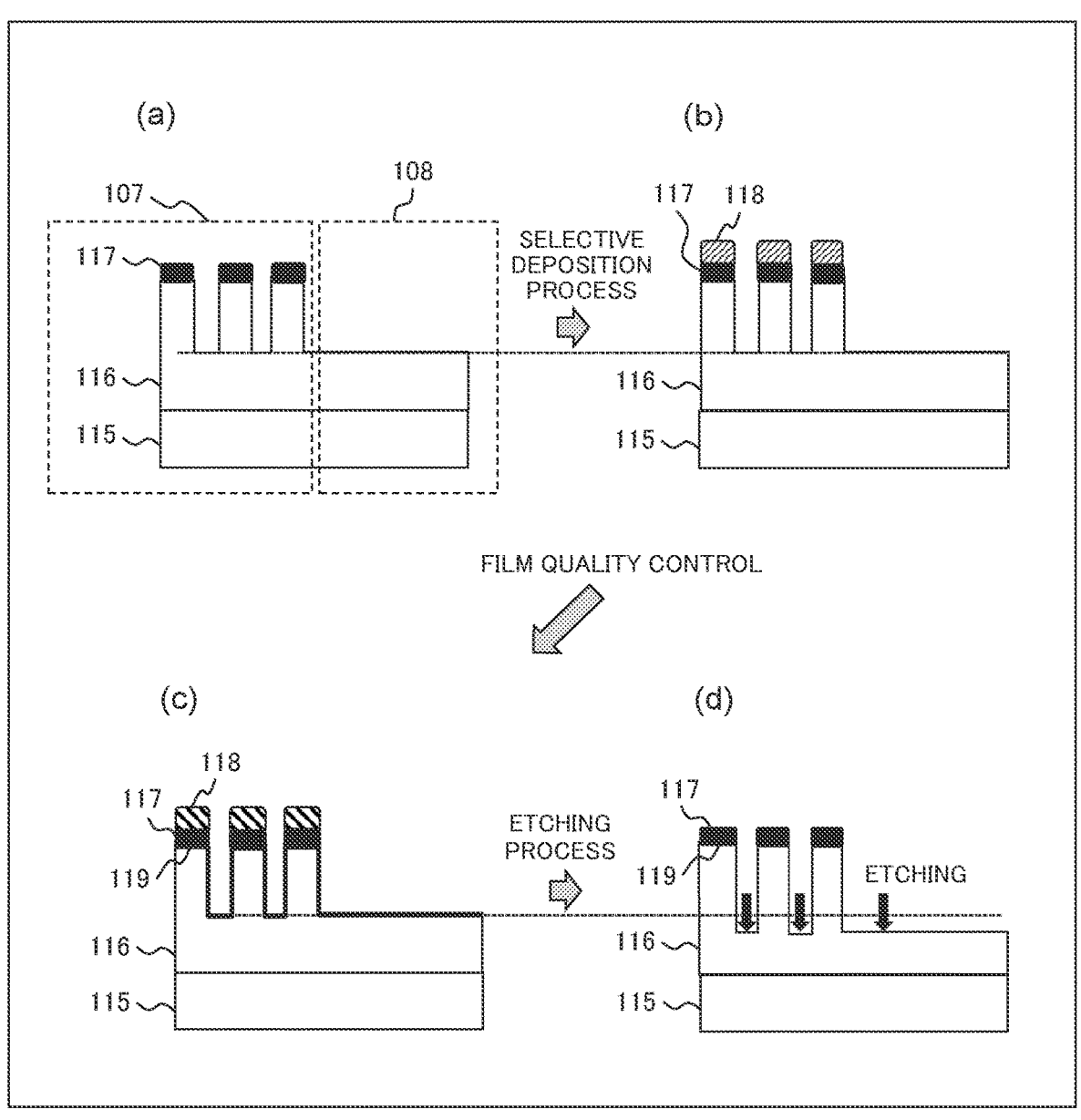
FIG. 6 is a cross-sectional view of a pattern for illustrating an example of a process flow in the protective film forming method according to the present example.

As an example of the etching method according to the present example, as shown in FIGS. 5 and 6, as compared with a pattern-dense region (also called a region in which patterns are dense) 107 and a non-pattern region (also called a region in which patterns are sparse) 108 coexist, a method of selectively forming a protective film (101 in FIG. 5 and 118 in FIG. 6) on a material of the pattern in the processing chamber 31, and then modifying the protective film (101 in FIG. 5 and 118 in FIG. 6) to ensure etching resistance will be described. Also, a method of processing with high selectivity a material to be etched (also referred to as a film to be etched, 103 in FIG. 5 and 116 in FIG. 6) formed on the sample using the modified protective film as a mask will be described.

Figure 2:
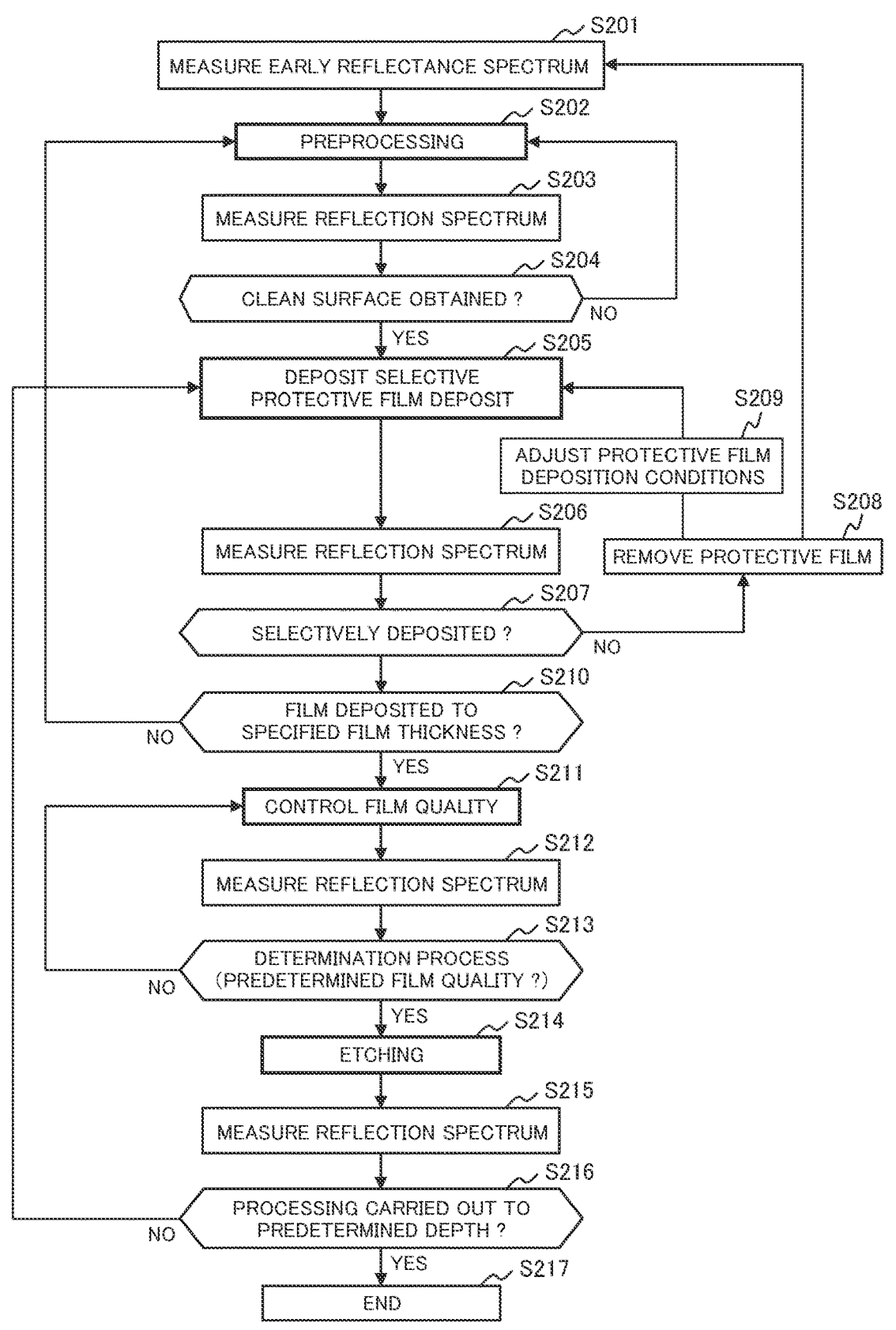
FIG. 2 is a diagram showing an example of a process flow in a protective film forming method according to an example.
Figure 3:
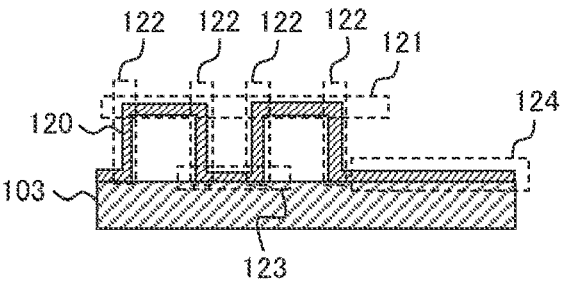
FIG. 3 is an illustrative diagram for illustrating a problem of one conventional method.
Figure 4:
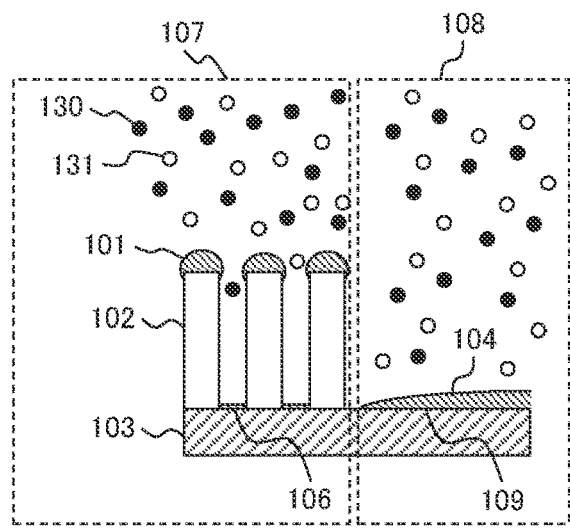
FIG. 4 is an illustrative diagram for illustrating a problem of another conventional method.

A plasma processing method according to the present example will be described with reference to FIG. 2. FIG. 2 is a diagram showing an example of a process flow in a selective protective film forming method according to the present example. FIG. 6 is an example of a pattern cross-sectional view for illustrating a process flow of the protective film forming method according to the present example. In the present example, as shown in FIG. 6(*a*), as compared with a pattern in which a pattern-dense region 107 and a non-pattern region 108 are mixed, a technique in which an unnecessary protective film (for example, 104 in FIG. 4) is not formed on the non-pattern region 108, and a Si-based protective film 118 is selectively formed on the material of a $SiO_2$ mask 117 on the pattern-dense pattern to suppress the etching of the mask 117 and process the pattern 116 to be etched with high selectivity will be described with reference to a flow of FIG. 2. In this example, the pattern to be etched 116 can also be referred to as a material to be etched or a film to be etched. In the wafer 100, the pattern 116 to be etched is formed on the substrate 115. In the present example, in the case where silicon dioxide ($SiO_2$) is used as the material of the mask 117 and silicon (Si) is used as the material of the pattern to be etched 116, a method of forming a silicon (Si)-based protective film (referred to as a Si-based protective film) 118 on the mask 117 will be described. The Si-based protective film is a protective film containing silicon elements. As the material containing oxygen (O), nitrogen (N), and carbon (C) can be used in the same manner in addition to Si such as $SiO_2$, silicon nitride (SiN), and silicon carbide (SiC: silicon carbide) as the material of the mask 117.

In the present example, in order to determine the selectivity of the protective film deposition and the film quality, a unit for acquiring the spectrum of the reflected light and determining the selectivity in the protective film deposition process is used.

First, an initial wafer serving as a reference is introduced into the processing chamber 31, and incident light 57 generated from the light source 56 is introduced into the processing chamber 31 through a window 62 for light transmission, and the wafer 100 is irradiated with the incident light 57. Then, the reflected light (interference light) 58 passes through the window 62 again and is detected by the detector 59. The light detected by the detector 59 passes through the optical fiber and is spectroscopically separated by the spectroscope 61. The reflection spectrum spectroscopically separated by the spectroscope 61 is stored in the storage unit 51 as an initial reflection spectrum (S201: initial reflection spectrum measurement).

Next, the pattern formed on the wafer 100 for etching is subjected to a pretreatment to remove a natural oxide film formed on the pattern surface, a residue generated in a previous process, and the like, and form a clean surface on the pattern (S202: pretreatment). S202 can also be said to be a cleaning step of cleaning the surface of the sample 100. The pretreatment (cleaning step) for forming a clean surface can use a method of etching only an outermost surface by plasma processing, a method of introducing only a gas into the processing chamber 31 without forming a plasma, and a method of volatilizing a gas, a plasma, or a reaction product generated by a chemical solution treatment by a heat treatment. As the pretreatment method by the plasma treatment, for example, there are a method of plasma treatment using a fluorine-based etching gas such as sulfur hexafluoride ($SF_6$) or trifluoromethane ($CHF_3$: methane trifluoride), or a method of plasma treatment using a gas containing halogen such as chlorine ($Cl_2$), and the like.

After forming a clean pattern surface, the incident light 57 generated from the light source 56 is irradiated onto the pattern for which the initial reflection spectrum has been acquired, and the spectrum of the reflected light 58 is measured (S203: reflection spectrum measurement). The acquired reflection spectrum is stored in the storage unit 51 in the same manner as the initial spectrum. The acquired reflection spectrum is compared with the reflection spectrum of the clean pattern stored in advance in the database 50DB to confirm that the surface has been cleaned (S204: clean surface?).

After the surface of the wafer 100 for etching has been cleaned, a protective film forming step is started to selectively deposit a protective film on the pattern material (S205: selective protective film deposition). In the protective film forming step (S205), a protective film (118) is selectively formed on a portion of the pattern formed on the sample 100 with respect to the pattern material. That is, in the protective film forming step (S205), the protective film (118) is selectively formed with respect to a desired material in the pattern formed on the film to be etched (116). The desired material is $SiO_2$, and the protective film 118 is formed only on $SiO_2$.

First, based on the control signal 54 from the device control unit 43, the protective film forming gas 34, the protective film forming gas 35, and the protective film forming gas 36 are supplied to the processing chamber 31 at a predetermined flow rate. The supplied protective film forming gas 34, protective film forming gas 35, and protective film forming gas 36 are turned into a plasma by the radio frequency power 53 applied to the radio frequency application unit 42, and decomposed into radicals, ions, and the like. At this time, a bias voltage 55 is applied to the sample 100 to irradiate the sample 100 with ions having energy of 10 eV or more. During this time, a pressure in the processing chamber 31 can be kept constant by the variable conductance valves and the vacuum pumps while a desired flow rate of the processing gas is flowing. Radicals and ions generated by the plasma reach the surface of the wafer 100 and form the protective film 118 shown in FIG. 6(*b*). The radicals and ions generated from the protective film forming gas 34 have a property of being combined with the pattern material on the pattern surface and deposited. The radicals and ions generated from the protective film forming gas 35 combine with some of the radicals and ions generated from the protective film forming gas 34 on the material of the surface of the wafer 100 in the plasma to form the protective film 118. When the protective film forming gas 36 becomes a plasma, the protective film forming gas 36 generates radicals and ions that have the property of preventing the protective film 118 from adhering to the Si surface, and combines with the radicals and ions generated from the protective film forming gas 34 to suppress the deposition of an unnecessary protective film (for example, 104 in FIG. 4) on the surface of the region 108 where there is no pattern. In other words, the protective film forming gas 34 is a gas that tends to deposit on the sample. The protective film forming gas 35 is a gas that forms the protective film 118 by reacting with the highly depositable gas (protective film forming gas 34). The protective film forming gas 36 is a gas that has an effect of removing unnecessary deposition components of the protective film (104 in FIG. 4). In the protective film forming step (S205), a mixed gas of the protective film forming gas 34, the protective film forming gas 35, and the protective film forming gas 36 is used.

In the present example, as an example, a case will be described in which the protective film 118 is not formed on Si, but the material of the mask 117 is $SiO_2$ by the selective protective film forming step (S205) in which the protective film 118 is formed only on $SiO_2$, the protective film 118 is selectively formed only on the mask 117 for the pattern in which the material of the surface of the region 108 in which the film 118 is not formed is Si, and an unnecessary protective film (for example, 104 in FIG. 4) is not formed in the non-pattern region 108 which is a wide region. As an example, silicon tetrachloride ($SiCl_4$: tetrachlorosilane) is used as the protective film forming gas 34, hydrogen ($H_2$) is used as the protective film forming gas 35, and chlorine ($Cl_2$) is supplied as the protective film forming gas 36 to the processing chamber 31 at a predetermined flow rate. That is, the protective film forming step (S205) uses a mixed gas of $SiCl_4$ gas, $H_2$ gas and $Cl_2$ gas.

Figure 7A:
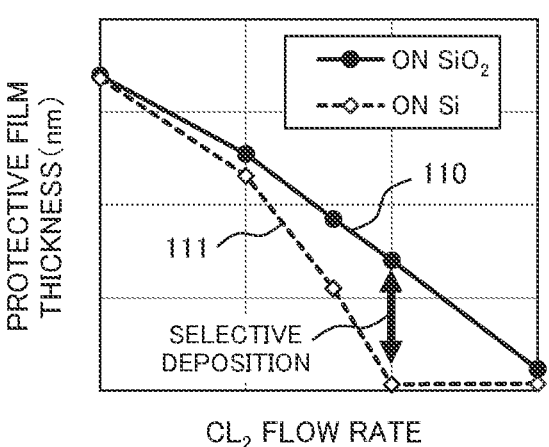
FIG. 7A is an illustrative diagram of an example of changes in a protective film thickness formed on Si and $SiO_2$ when forming a protective film by adding $Cl_2$ to a mixed gas of $SiCl_4$ and $H_2$, depending on a $Cl_2$ flow rate.
Figure 7B:
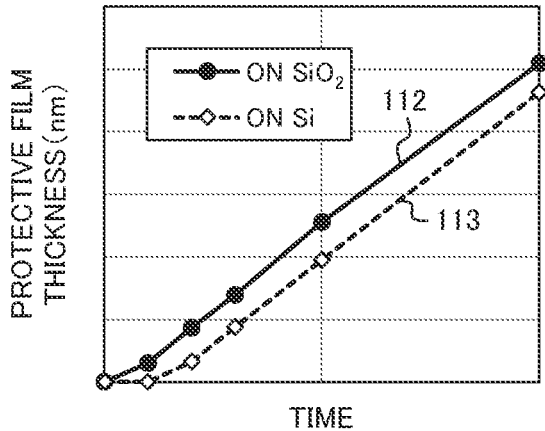
FIG. 7B is an illustrative view of an example of a processing time dependence of a deposition process of the protective film under one condition in which the protective film is formed only on $SiO_2$ and not formed on Si.

FIG. 7A shows an illustrative diagram of an example of changes in the protective film thickness (nm) formed on Si and $SiO_2$ when $Cl_2$ is added to a mixed gas of $SiCl_4$ and $H_2$ to form the protective film 118, depending on a $Cl_a$ flow rate. A line 110 indicates a thickness of the protective film 118 formed on $SiO_2$, and a line 111 indicates the thickness of the protective film 118 formed on Si. When the $Cl_2$ flow rate is small, there is no difference in the thickness of the protective films 118 formed on Si and $SiO_2$. However, the present inventors have found that there is a phenomenon that the protective film is formed only on $SiO_2$ and no protective film is formed on Si when the $Cl_2$ flow rate is increased to a certain value or more. FIG. 7B shows an illustrative diagram of an example of dependence of the protective film thickness (nm) on the processing time of the deposition process under one condition in which the protective film is formed only on $SiO_2$ and not formed on Si. A line 112 indicates a relationship between the thickness of the protective film 118 formed on $SiO_2$ and the processing time of the deposition process, and a line 113 indicates a relationship between the thickness of the protective film 118 formed on Si and the processing time of the deposition process. When the processing time is a certain period or longer, the protective film 118 is formed on both $SiO_2$ and Si. However, when the processing time is not longer than the certain period, the protective film 118 is formed on $SiO_2$, and it is clear that the protective film can be selectively formed on the material.

In addition to the above description, the protective film forming gas 34 may be an Si-based gas such as $SiCl_4$, silicon tetrafluoride ($SiF_4$), or silicon tetrahydride ($SiH_4$: monosilane) when, for example, a film containing Si such as Si (silicon elements) is deposited on the $SiO_2$ material as the protective film 118. As the protective film forming gas 35, for example, a gas containing H such as $H_2$, hydrogen bromide (HBr), ammonia ($NH_3$), and fluoromethane ($CH_3F$) is used. As the protective film forming gas 36, a gas having a property of removing a deposited film containing Si as a main component, for example, $Cl_2$ is used.

When $SiCl_4$ is used as the protective film forming gas 34, $H_2$ is used as the protective film forming gas 35, and $Cl_2$ is used as the protective film forming gas 36, the radio frequency power 53 decomposes the gas into a plasma in the processing chamber 31 to generate radicals and ions such as $SiCl_x$, H, and Cl and the surface of the wafer 100 is irradiated with those radicals and ions. When $SiCl_x$ radicals are irradiated onto $SiO_2$ of the mask material, the $SiCl_x$ radicals bond with O on the $SiO_2$ surface and adsorb to the surface. At this time, most of Cl in $SiCl_x$ reacts with H radicals to become HCl and desorb from the surface. Dangling bonds of Si adsorbed on $SiO_2$ react with H radicals to form a protective film 118 containing H and Si. At this time, a small amount of Cl that did not react with H remains in the protective film 118. When the Si-based protective film 118 containing H starts to be formed on $SiO_2$, the Si-based protective film 118 becomes thicker depending on the processing time because $SiCl_x$ radicals are likely to bond with dangling bonds of Si in the protective film 118.

On the other hand, when Si, which is the material of the surface of the region 108 where the protective film 118 is not formed, is irradiated with $SiCl_x$ radicals, the $SiCl_x$ radicals are less likely to react with Si than $SiO_2$, and further react with Cl radicals irradiated from the plasma, or desorb from the Si surface by being bombarded with ions. Therefore, it has been found that if enough Cl radicals and ions are irradiated to re-desorb the $SiCl_x$ radicals that have reached the Si surface, the Si-based protective film 118 is formed on $SiO_2$, but the protective film 118 is not formed on Si. However, if a large amount of $SiCl_x$ radicals is continuously irradiated for a long time, Si is gradually adsorbed, and therefore in order to selectively form the protective film 118 on $SiO_2$, it is necessary to control $SiCl_x$ radicals, Cl radicals, ion irradiation amount, and irradiation time.

As a condition in which the Si-based protective film 118 is formed on $SiO_2$, but is not formed on Si, the $SiCl_4$ flow rate/$Cl_2$ flow rate is required to be smaller than 1, and a bias voltage 55 is applied to the wafer 100 to irradiate the wafer 100 with ions so that the $SiCl_x$ component on the Si surface can be effectively removed.

After the protective film deposition step (S205), the incident light 57 generated from the light source 56 is again irradiated onto the pattern, and the spectrum of the reflected light 58 is measured (S206: reflection spectrum measurement). The obtained reflection spectrum is compared with the reflection spectrum from the reference pattern on which the protective film 118 has been selectively deposited, which has been stored in the database 50 in advance, to determine whether the protective film 118 is selectively formed (S207: selectively deposited?). Furthermore, the determination unit 49 can calculate the thickness of the protective film 118 and the pattern width (dimensions) selectively formed from the reflection spectrum from the reference pattern stored in advance in the database 50DB and the reflection spectrum acquired after forming the protective film 118.

If it is determined by the above method that the protective film 118 has not been selectively formed, a protective film removing step is carried out (S208: protective film removal). When the protective film removing step (S208) starts, the protective film removing gas is supplied to the processing chamber 31 at a predetermined flow rate. The supplied protective film removing gas becomes a plasma by the radio frequency power 53 applied to the radio frequency application unit 42, decomposes into ions and radicals, and irradiates the surface of the wafer 100.

After the protective film removing step (S208) has been completed, the initial spectrum to be used as a reference is acquired again (S201), and after the pretreatment (S202) has been carried out, the selective protective film deposition step (S205) is carried out again. At this time, the conditions for the selective protective film deposition step (S205) to be performed again are adjusted to conditions corrected by the determination unit 49 based on the measurement result of the reflection spectrum after the protective film forming step performed last time, which is saved in the storage unit 51 (S209: adjustment of protective film deposition conditions). For example, when it is determined that the protective film 118 is not selectively formed from the reflection spectrum after the protective film forming process performed last time, for example, the protective deposition conditions are determined to conditions in which the $Cl_2$ flow rate, which is the protective film forming gas 36, is increased by a predetermined amount, and the protective film deposition step is performed under the determined conditions (S205).

Further, when selectively forming a relatively thick protective film 118, or when etching the material 116 to be etched deeply, the selective protective film deposition step (S205) and the pretreatment (S202) are repeated to selectively form the relatively thick protective film 118. As shown in FIG. 7B, if the protective film deposition step (S205) is performed for a certain period of time or more, the material selectivity is lost so that the processing time is set within a range where the selectivity is not lost. If the thickness of the protective film 118 formed after the protective film deposition step (S205) has not reached the predetermined film thickness, the pretreatment (S202) is performed again. This leaves the material on which the protective film 118 is not to be formed clean. On the other hand, on the material on which the protective film 118 is formed, it is necessary to set the processing conditions such as the processing time so that the surface does not return to the initial state even if the pretreatment is performed. The steps S202 to S210 are repeated until the protective film 118 has reached a predetermined film thickness, so that the thick protective film 118 can be selectively formed. FIG. 12 shows changes in protective film thicknesses deposited on Si and SiO$_2$ depending on the number of repetitions (number of cycles). In FIG. 12, a vertical axis indicates the film thickness of the protective film 118 (protective film thickness), and a horizontal axis indicates the number of cycle repetitions (cycle number). In FIG. 12, a line 310 indicates the thickness of the protective film 118 deposited on SiO$_2$, and a line 311 indicates the thickness of the protective film 118 deposited on Si.

It has been confirmed by the present technique that the protective film 118 is not formed on Si, and the thick protective film 118 can be formed only on SiO$_2$. When it is determined that the protective film 118 is selectively deposited by performing the above-described processing (Yes in S207), and when it is further determined that the protective film 118 is deposited to a predetermined thickness (Yes in S210), a film quality control process (also referred to as a protective film modification process) of the protective film 118 is performed (S211: film quality control).

Among the above methods, for example, in the protective film deposition step (S205), when the Si-based protective film 118 is formed by using SiCl$_4$ as the protective film forming gas 34, H$_2$ as the protective film forming gas 35, and Cl$_2$ as the protective film forming gas 36, there is a need to ensure the etching resistance of the protective film 118 when etching Si of the underlying layer 116 to be etched. In order to secure the etching resistance of the protective film 118, the protective film 118 is oxidized so as to have a predetermined composition (desired oxygen concentration) to implement a film quality control step (S211) of the protective film 118 for modifying the protective film 118. The film quality control step (S211) can also be rephrased as an oxidation step of oxidizing the protective film 118.

First, based on the control signal 54 from the device control unit 43, the film quality control gas 37 is supplied to the processing chamber 31 at a predetermined flow rate. As the film quality control gas 37, a mixed gas containing O such as oxygen (O$_2$), carbon dioxide (CO$_2$), sulfur dioxide (SO$_2$), etc. is supplied to the processing chamber 31. The supplied gas becomes a plasma by the radio frequency power 53 applied to the radio frequency application unit 42, decomposes into radicals, ions, etc., and irradiates the surface of the wafer 100.

As shown in FIG. 6(*c*), the O radicals irradiated to the Si-based protective film 118 bond with Si in the protective film 118 and are oxidized to SiOx. As a result, the film quality of the Si-based protective film 118 is modified.

Figure 8:
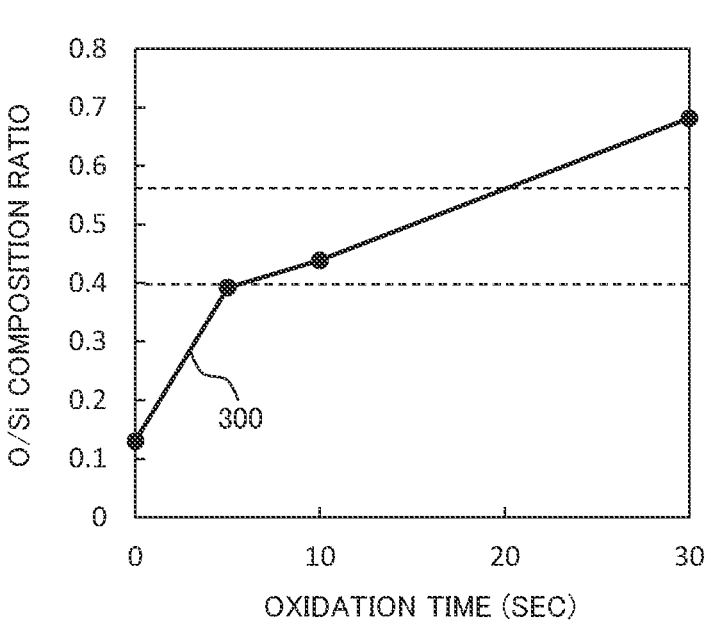
FIG. 8 is an illustrative diagram of an example of an oxidation time dependence of an O/Si composition ratio of a protective film in a protective film modifying method according to the present example.

FIG. 8 shows an oxidation time dependence of an O/Si composition ratio when the Si-based protective film 118 is oxidized by O$_2$ plasma. In FIG. 8, a vertical axis indicates an O/Si composition ratio, and a horizontal axis indicates an oxidation time (seconds). A line 300 indicates the experimental results. The O/Si composition ratio is a ratio of the oxygen element O to the silicon element (Si), and the O/Si composition ratio can also be said to be the concentration ratio of O/Si. As shown in FIG. 8, it can be seen that when the oxidation treatment is performed, the O concentration suddenly increases in about 5 seconds and oxidation proceeds, and after that, oxidation proceeds as the oxidation time increases.

Figure 9:
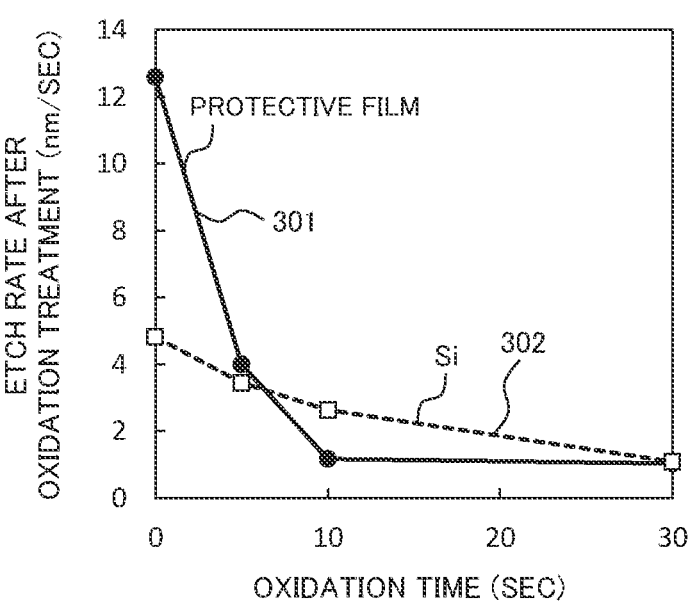
FIG. 9 is an illustrative diagram of an example of an oxidation time dependence of an etching rate of the protective film and an Si substrate in the protective film modifying method according to the present example.

FIG. 9 shows the oxidation time dependences of the etching rate of the protective film 118 and the Si substrate (116) when the protective film 118 and the Si substrate (116: wafer 100) are oxidized and then etched in the next etching step (S214). In FIG. 9, a vertical axis indicates an etching rate (nm/sec) of the protective film 118 or the Si substrate after oxidation, and a horizontal axis indicates an oxidation time (sec). A line 301 indicates the protective film 118 and a line 302 indicates the Si substrate. As indicated by the line 301, the Si-based protective film 118 has a high etch rate and low etching resistance when the Si-based protective film 118 is simply deposited. However, it can be seen that when an oxidization treatment is performed, the etch rate of the Si-based protective film 118 is lowered and the etching resistance of the protective film 118 is improved. As indicated by the line 302, the etch rate of the Si substrate also decreases as the oxidation time increases. However, the present inventors have found that when the oxidation time is about 5 to 20 seconds, that is, when the O/Si composition ratio of the Si-based protective film 118 is about 0.4 to 0.6, the etch rate of the Si-based protective film 118 is reduced to Si substrate (116), and the Si substrate (116) can be etched without etching the material of the mask 117 while the Si-based protective film 118 remains, and the selectivity can be effectively improved.

Figures 10, 11A:
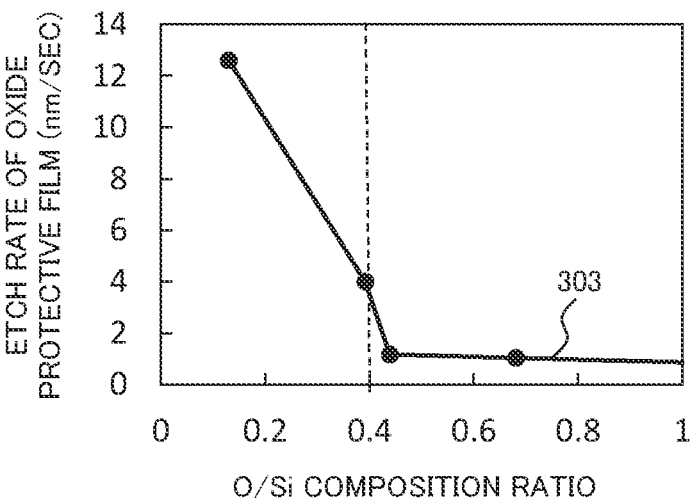
FIG. 10 is an illustrative diagram showing a relationship between an O/Si composition ratio of the protective film and an etch rate of the protective film in the protective film modifying method according to the present example.
FIG. 11A is a schematic diagram showing a bonding state of Si in a protective film 118 when Si is not oxidized at all.

FIG. 10 shows a relationship between the O/Si composition ratio of the Si-based protective film 118 and the etch rate of the oxidized protective film 118 in the etching step (S214). In FIG. 10, a vertical axis indicates etching (nm/sec) of the oxidized protective film 118 and a horizontal axis indicates an O/Si composition ratio of the Si-based protective film 118. A line 303 shows the experimental results. It has been found that when the O/Si composition ratio of the Si-based protective film 118 reaches 0.4, the etch rate abruptly decreases and the etching resistance of the protective film 118 is improved. That is, the composition ratio (O/Si) of the oxygen element in the oxidized protective film 118 is the composition ratio at which the etching rate of the oxidized protective film 118 is lower than the etching rate of the film to be etched 116. In this example, the composition ratio of oxygen elements to silicon elements in the protective film 118 containing the silicon elements is preferably within a range of 0.4 to 0.6.

Next, the reason why the etching resistance of the protective film 118 is dramatically improved when the oxidation treatment is performed so that the O/Si composition ratio of the Si-based protective film 118 is about 0.4 to 0.6 will be described with reference to model diagrams of FIGS. 11A and 11B. FIG. 11A is a schematic diagram showing the bonding state of Si in the protective film 118 when Si is not oxidized at all, and FIG. 11B is a schematic diagram showing a bonding state of Si in the protective film 118 when the O/S composition ratio is 0.5.

When Si is not oxidized at all (see FIG. 11A), Si—Si bonds, Si—H bonds, or Si dangling bonds that do not bonded to any element are formed. Energy required to break the Si—Si bond is 327 kJ/ml, and energy required to break the Si—H bond is 298 kJ/ml.

On the other hand, when the O/Si composition ratio is 0.5 (see FIG. 11B), at least one of the four bonds of Si is Si—O on average. The energy required to break the Si—O bond is 798 kJ/ml, and the energy larger than that of Si—Si and Si—H is required. Therefore, it has been found that the etching resistance can be effectively improved by oxidizing the Si-based protective film so that the O/Si composition ratio is about 0.5.

When oxygen plasma is generated in the processing chamber 31 to oxidize the Si-based protective film 118, the region 108 having no pattern which is a region to be etched is also oxidized. However, as shown in FIG. 9, the etch rate of the Si-based protective film 118 is lower than that of the Si substrate (116) which is the region 108 to be etched when the oxidation time is between 5 seconds and 20 seconds. This is because the Si-based protective film 118 contains Si—H, Si dangling bonds, and a small amount of Si—Cl, and those bonds are more likely to react with O than Si—Si bonds and be oxidized. Therefore, oxidation progresses faster than the Si substrate (116), and the entire Si-based protective film 118 is oxidized. On the other hand, since the Si substrate (116) has excellent crystallinity, oxidation progresses slowly from an outermost surface to a deep part. Therefore, the entire Si-based protective film 118 is oxidized more quickly, and etching resistance can be ensured.

As an example of determining that the film quality has been controlled to a desired degree of oxidation, after the film quality control step (S211), the incident light 57 generated from the light source 56 is irradiated onto the pattern, and the spectrum of the reflected light 58 is measured (S212: reflectance spectrum measurement).

The acquired reflection spectrum is stored in the storage unit 51 in the same manner as the initial spectrum, and sent to the determination unit 49 in the deposition process control unit 48. The acquired reflection spectrum can be compared with the reflection spectrum (reference spectrum) from the reference pattern controlled to the desired O/Si composition ratio stored in the database 50 in advance, and the film quality can be determined (S213: determination step (predetermined film quality?)). That is, the pattern of the sample 100 is irradiated with the incident light 57 generated from the light source 56, and the spectrum of the interference light (reflected light 58) reflected from the sample 100 is monitored. Then, a determination step of determining that the protective film 118 selectively formed on the sample 100 has been modified in a range of a desired oxygen concentration based on the comparison results of the obtained reference spectrum pattern and the monitored (measured) spectrum pattern of the interference light (reflected light 58) is carried out. In the determination step, it is determined whether or not the composition ratio of oxygen elements is within a desired composition ratio range (the composition ratio of oxygen elements to silicon elements is within a range of 0.4 to 0.6) based on the result of comparison between the spectrum of the interference light (reference spectrum) and the monitored spectrum of the interference light (reflected light 58) when the composition ratio of the oxygen elements is the desired composition ratio.

After the film quality control of the protective film 118 (S211) has been completed, the material 116 to be etched is plasma-etched using the formed protective film 118 and the mask 117 originally formed in the pattern as an etching mask (S214: etching).

In the etching step (S214), first, the device control unit 43 controls the gas supply unit 33 to supply the etching gas 38 to the processing chamber 31 at a predetermined flow rate. In a state in which the etching gas 38 is supplied and the inside of the processing chamber 31 reaches a predetermined pressure, the device control unit 43 controls the radio frequency power source 63 to apply the radio frequency power 53 to the radio frequency application unit 42, and generate a plasma inside the processing chamber 31 by the etching gas 38. As shown in FIG. 6(d), the plasma of the etching gas 38 generated inside the processing chamber 31 is used to etch the wafer 100 having the protective film 118 formed thereon. The etching gas 38 becomes a plasma to generate radicals and ions that etch the material 116 to be etched. If the protective film 118 is made of a Si-based material, the etching gas 38 can be, for example, $Cl_2$ gas. Alternatively, the etching gas 38 can be a mixed gas of halogen gas such as $Cl_2$ or HBr and $O_2$. The ions generated from the etching gas 38 are accelerated by the bias voltage 55 applied to the wafer stage 32 from the bias power supply 41 controlled by the bias control unit 47 and irradiated onto the surface of the wafer 100. When the pattern is irradiated with ions, the ions pass through the oxide film formed on the Si substrate 116 but the ions of energy that do not pass through the protective film 118 are irradiated, that is, the ions having energy whose range is smaller than the thickness of the protective film 118 and larger than the oxide film thickness formed on the surface of the Si substrate 116 are irradiated. In other words, the energy of the ions with which the sample 100 is irradiated in the etching step (S214) is energy that does not pass through the protective film 118. As a result, although the etching of the Si substrate 116, which is the region to be etched, proceeds, the etching of the mask 117 is suppressed, and the Si substrate 116 can be etched with high selectivity and accuracy.

In this example, while performing the etching process in the etching step (S214), the film thickness of the protective film is measured by the optical system 39 (S215: reflection spectrum measurement), the thickness of the protective film 118 is measured until the pattern to be etched 116 on the wafer 100 is etched to a desired depth (S216), and etching is completed when reaching a predetermined etching processing time or a desired depth (S217: end).

In this example, in the etching step (S217), the thickness of the protective film 118 may become equal to or less than a specified value before reaching a desired etching depth. In such a case (No in S216), the process returns to the selective protective film deposition step (S205), starts again from the deposition step of the protective film 118, and the deposition of the protective film 118 is selectively carried out until the film thickness of the protective film 118 reaches the predetermined film thickness again. That is, after the etching step (S217), if the etching depth of the pattern to be etched (film to be etched) 116 has not reached a predetermined depth, the protective film forming step (S205) is performed. As described above, S205 to S216 are repeated until the pattern to be etched 116 on the wafer 100 is etched to a predetermined depth. The etching of the pattern to be etched 116 is finished when the pattern to be etched 116 reaches a predetermined etching depth. Furthermore, after etching the pattern 116 to be etched, the protective film 118 deposited on the pattern surface can be removed. Only the protective film 118 may be removed, or when the protective film 118 is formed on the mask 117, the protective film 118 remaining on the surface of the mask 117 may be removed together with the mask 117.

The wafer 100 is subjected to such plasma processing so that the protective film 118 ensuring the etching resistance can be formed only on the top surface of the mask 117 on the pattern without forming an unnecessary protective film on the non-pattern region 108. As a result, by solving the problem with the conventional art that the top surface of the mask 117 and the top surface of the pattern 119 are etched and the depth of the pattern becomes shallow, and the problem with the conventional art that the top surface of the mask 117 is unintentionally etched while the underlying layer to be etched 116 is etched, a desired pattern shape can be obtained by the present example.

In the above-described example, the technique has been described in which the mask 117 and the underlying layer 116 to be etched are formed as the pattern to be etched, and when the pattern-dense region 107 and the non-pattern region 108 are mixed in the mask pattern, the protective film 118 is selectively formed on the material of the mask 117 on the dense pattern without forming an unnecessary protective film on the material to be etched in the non-pattern region 108 and the etching of the mask 117 and the pattern top surface 119 is suppressed to process the pattern to be etched 116 with high selectivity.

Although the invention made by the present inventors has been specifically described above based on the examples, it is needless to say that the invention is not limited to the above examples, and various modifications can be made without departing from the spirit of the invention. For example, the above-described examples have been described in detail in order to describe the present invention in an easy-to-understand manner, and are not necessarily limited to those having all the described configurations. Moreover, it is possible to add, delete, or replace a part of the configuration of each example with another configuration.

REFERENCE SIGNS LIST

30: etching apparatus, 31: processing chamber, 32: wafer stage, 33: gas supply unit, 34: protective film forming gas, 35: protective film forming gas, 36: protective film forming gas, 37: film quality control gas, 38: etching gas, 39: optical system, 40: optical system control unit, 41: bias power supply, 42: radio frequency application unit, 43: device control unit, 44: gas control unit, 45: exhaust system control unit, 46: radio frequency control unit, 47: bias control unit, 48: deposition process control unit, 49: determination unit, 50: database, 51: storage unit, 53: radio frequency power, 54: control signal, 56: light source, 57: incidence light, 58: reflected light, 59: detector, 61: spectrometer, 62: window, 63: radio frequency power supply, 100: wafer, 101: protective film, 102: pattern, 103: substrate, 104: unnecessary protective film, 106: bottom of pattern, 107: pattern-dense region, 108: non-pattern region, 109: surface of non-pattern region, 115: substrate, 116: pattern to be etched, 117: mask, 118: protective film, 119: pattern top surface, 110: change in protective film thickness on $SiO_2$ with $Cl_2$ flow rate, 111: change in protective film thickness on Si with $Cl_2$ flow rate, 112: change in protective film thickness on $SiO_2$ over processing time, 113: change in protective film thickness on Si with processing time, 120: deposition film, 121: pattern top surface, 122: side surface, 123: bottom surface, 124: non-pattern region, 130: ion, 131: radical

The invention claimed is:

1. A plasma processing method for plasma etching a film to be etched formed on a sample, comprising:

a cleaning step of cleaning a surface of the sample;

a protective film forming step of selectively forming a protective film on a desired material in a pattern formed on the film to be etched;

an oxidation step of oxidizing the protective film after the protective film forming step; and an etching step of plasma etching the film to be etched, wherein the protective film forming step further comprises supplying a $SiCl_4$ gas and a CL gas to the pattern at a $SiCl_4/Cl_2$ flow rate ratio of less than 1 while forming a plasma using radio frequency power to cause the protective film to be formed only on the desired material in the pattern and not on the film to be etched.

2. The plasma processing method according to claim 1, wherein a composition ratio of oxygen elements in the oxidized protective film is such that an etching rate of the oxidized protective film is lower than an etching rate of the film to be etched.

3. The plasma processing method according to claim 2, wherein the protective film contains silicon elements, and a composition ratio of the oxygen elements to the silicon elements in the protective film is a value within a range of 0.4 to 0.6.

4. The plasma processing method according to claim 3, wherein energy of ions irradiated to the sample in the etching step is energy that does not pass through the protective film.

5. The plasma processing method according to claim 2, further comprising:

a determination step of monitoring a spectrum of interference light reflected from the sample, and determining whether the composition ratio of the oxygen elements is within a desired composition ratio range based on a result of comparison between the spectrum of the interference light and the monitored spectrum of the interference light when the composition ratio of the oxygen elements is a desired composition ratio.

6. The plasma processing method according to claim 2, wherein after the etching step, the protective film forming step is performed if a depth of the film to be etched has not reached a predetermined depth.

7. The plasma processing method according to claim 2, wherein the protective film forming step uses a mixed gas of the $SiCl_4$ gas, $H_2$ gas, and the $Cl_2$ gas.

8. The plasma processing method according to claim 1, wherein after the etching step, the protective film forming step is performed if a depth of the film to be etched has not reached a predetermined depth.

9. The plasma processing method according to claim 8, wherein the protective film forming step uses a mixed gas of the $SiCl_4$ gas, $H_2$ gas, and the $Cl_2$ gas.

10. The plasma processing method according to claim 1, wherein the protective film forming step uses a mixed gas of the $SiCl_4$ gas, $H_2$ gas, and the $Cl_2$ gas.

* * * * *